US012647663B2

(12) United States Patent
Birnbaum

(10) Patent No.: US 12,647,663 B2
(45) Date of Patent: Jun. 2, 2026

(54) FLUID-FILLED CAMERA MODULES

(71) Applicant: Apple Inc., Cupertino, CA (US)

(72) Inventor: Zachary W. Birnbaum, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 84 days.

(21) Appl. No.: 18/657,544

(22) Filed: May 7, 2024

(65) Prior Publication Data
US 2025/0080815 A1 Mar. 6, 2025

Related U.S. Application Data

(60) Provisional application No. 63/535,963, filed on Aug. 31, 2023.

(51) Int. Cl.
| | |
|---|---|
| *H04N 5/335* | (2011.01) |
| *H04N 23/51* | (2023.01) |
| *H04N 23/52* | (2023.01) |
| *H05K 7/20* | (2006.01) |

(52) U.S. Cl.
CPC ............. *H04N 23/52* (2023.01); *H04N 23/51* (2023.01); *H05K 7/20236* (2013.01)

(58) Field of Classification Search
None
See application file for complete search history.

(56) References Cited

U.S. PATENT DOCUMENTS

| | | | | |
|---|---|---|---|---|
| 8,200,074 | B1 * | 6/2012 | Melancon | G03B 17/08 396/25 |
| 9,164,202 | B2 | 10/2015 | Batchko et al. | |
| 9,225,883 | B2 * | 12/2015 | Kossin | G03B 17/08 |
| 10,261,392 | B2 | 4/2019 | Bolis | |
| 10,852,553 | B2 | 12/2020 | Pedder et al. | |
| 11,346,984 | B2 * | 5/2022 | Karam | G02B 7/28 |
| 2021/0286108 | A1 | 9/2021 | Topliss et al. | |
| 2024/0069245 | A1 * | 2/2024 | Burger | G02B 3/14 |
| 2024/0236451 | A1 * | 7/2024 | Cappiello | H04N 23/51 |

FOREIGN PATENT DOCUMENTS

EP 3719569 10/2020

OTHER PUBLICATIONS

Simon et al., "Optical design rules of a camera module with a liquid lens and principle of command for AF and OIS functions." SPIE/ COS Photonics Asia (2010).

* cited by examiner

*Primary Examiner* — Gary C Vieaux
(74) *Attorney, Agent, or Firm* — Brownstein Hyatt Farber Schreck, LLP

(57) ABSTRACT
A camera module for an electronic device includes a module housing that encloses an actuator structure for positioning an element of the camera module, such as an image sensor or a lens element. A flexible seal subdivides an internal volume of the camera module housing into two separate sub-volumes. A first fluid is retained within a first sub-volume between the image sensor and the lens element, and a second fluid is retained within a second sub-volume of the module housing. In one construction the first fluid is air, and the second fluid is a dielectric liquid.

14 Claims, 8 Drawing Sheets

100

102

104

106

200

300

320

322

314

312

304

308

310

310 310

302

306

318

316

300

320

314

316

A-A

600

FLUID-FILLED CAMERA MODULES

CROSS-REFERENCE TO RELATED APPLICATIONS

This application is a nonprovisional and claims the benefit under 35 U.S.C. 119 (e) of U.S. Provisional Patent Application No. 63/535,963, filed Aug. 31, 2023, the contents of which are incorporated herein by reference as if fully disclosed herein.

TECHNICAL FIELD

Embodiments described herein relate to camera modules for portable electronic devices and, in particular, to camera modules including a sealed liquid volume.

BACKGROUND

A portable electronic device may include a camera module for capturing an image. A conventional camera module includes an image sensor aligned with a focal plane defined by a lens group. In many cases, one or more lenses of the lens group and/or the image sensor itself may be movable to adjust focus and/or for optical image stabilization.

Image sensors, actuators, processing circuitry, and other electronic components within a camera module can generate significant waste heat. As a result, many camera modules are artificially performance limited. For example, high speed autofocus operations and/or high framerate modes may only be usable for limited period before a thermal shutoff threshold is reached.

SUMMARY

Embodiments described herein take the form of a camera module including: a module housing defined by an upper housing part with a lens opening and a lower housing part; a lens element disposed within the lens opening; a substrate within the module housing below the lens element; an image sensor disposed on the movable substrate and aligned with the lens element; a flexible seal coupling the substrate to the lens element. The flexible seal defines a first sealed volume between the image sensor and the lens element and a second sealed volume between an exterior surface of the flexible seal and an interior surface of the module housing. The camera module includes a first fluid retained within the first sealed volume and a second fluid retained within the second sealed volume.

Some embodiments described herein take the form of a camera module including: a module housing; a lens element extending through the module housing; a substrate within the module housing below the lens element and supporting an electronic component; an image sensor disposed on the substrate; a seal coupling the substrate to the lens element and defining a sealed volume between an exterior surface of the seal and an interior surface of the module housing; and a fluid retained within the sealed volume and configured to absorb and dissipate heat generated by the electronic component and the image sensor.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1A:
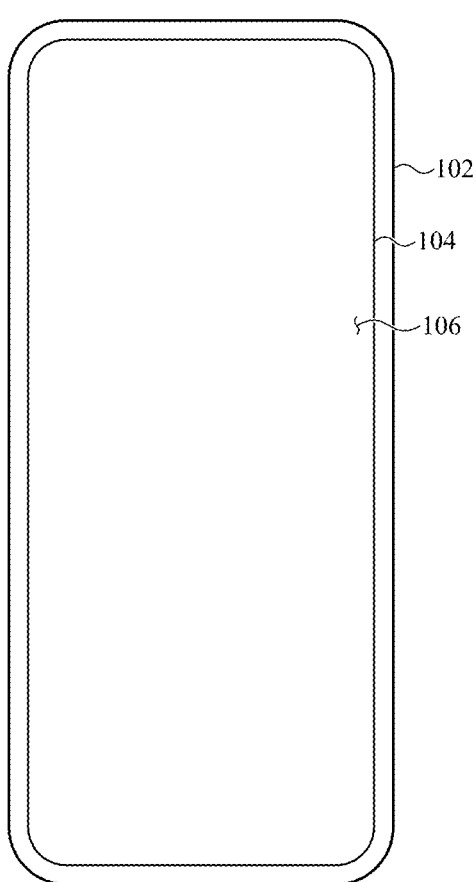
FIG. 1A depicts an example electronic device that can include a camera system and/or camera module, such as described herein.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein relate to systems for managing heat accumulation in camera modules configured for electronic devices.

A camera module as described herein can include one or more movable parts. For example, a camera module can include an optical image stabilization system and/or an autofocus system each configured to move a lens or an image sensor.

For example, a camera module as described herein can include one or more coils to physically move one or more movable elements of that camera module. Principles of operation may vary from embodiment to embodiment, but in many cases and constructions, a coil may be used to leverage Lorenz force to physically move the coil itself (relative to a magnetic field of a magnet such as a permanent magnet) or another body mechanically coupled to a movable element. In some cases, an image sensor of a camera module may be movable (e.g., translatable in plane, movable in a Z axis, tiltable, and so on). In other cases, one or more lenses of a lens group positioned over an image sensor may be movable. In some constructions, both lenses and an image sensor may be movable.

A camera module can include multiple coils for physically moving or relocating multiple movable elements of that camera module, but for simplicity of description and illustration, single coils are described herein. In other cases, other actuators may be used to move elements or components within a camera module. In some cases, multiple actuators of different actuation types or modalities may be used.

In many embodiments, a camera module takes a small form factor so as to be incorporable into a portable electronic device. For simplicity of description, implementations in which a camera module is constructed to be incorporated into a portable electronic device are described herein, although it may be appreciated that this is merely one example, and that coils as described herein (and more broadly camera modules as described herein) can take any suitable form factor.

As known to a person of skill in the art, electronic components such as actuation systems along with image sensors (as well as any imaging processors or other processing circuitry included in the camera module) generate waste heat when in operation. A camera module may generate significant waste heat during particular operations, such as during high speed autofocus operations and/or during high speed imaging operations (e.g., high frame rate). For conventional systems, a thermal cutoff threshold may be reached quickly, after which one or more operations of the camera module may be throttled thereby limiting performance. In other cases, conventional camera modules may be performance limited by design such that thermal throttling or monitoring is not required.

In other cases, a source of heat that causes or contributes to thermal throttling of a conventional camera module may be external to the camera module itself. For example, nearby electronic components may generate waste heat that in turn may locally increase temperature of the camera module, potentially triggering a thermal throttling event.

Embodiments described herein account for these and other drawbacks of conventional camera modules by including a fluid volume within the camera module itself. The fluid may be a dielectric fluid in many embodiments (although this may not be required if electronic components are suitably capped or otherwise sealed), such as a liquid dielectric. An example fluid is mineral oil. The fluid can serve as a heat sink and/or a thermal mass capable to absorb waste heat generated by the camera module or another source of heat. This may be particularly advantageous when the fluid is used to cool moveable components within the camera module (e.g., a moving image sensor), as it may not be possible to thermally bond these components to a housing of the camera module.

Additionally, the use of a liquid may act to dampen movement of components within the camera module (e.g., passive movement resulting from vibration or external forces applied to the camera module and/or unintended ringing that may occur as a result controlled movement of a component), which may reduce damage to or wear on these components over time. For example, in instances where a device incorporating the camera module is dropped, the fluid may reduce the resulting force of an impact that may occur between components of the camera module (e.g., by reducing the speed of relative movement between these components) and thereby reduce the likelihood that these components are damaged.

Specifically, embodiments described herein take the form of a camera module including at least a module housing enclosing an interior volume. The module housing can be defined by an upper housing part and a lower housing part.

The camera module includes a substrate that supports an image sensor and/or one or more filters such as infrared cut filters. In some example constructions, the substrate itself includes an aperture through a central region thereof and an image sensor is disposed on a lower surface of the substrate (e.g., to overlap the aperture below the substrate), and an infrared cut filter is positioned and coupled to an upper surface of the substrate (e.g., to overlap the aperture above the substrate). This construction is not required of all embodiments and in some cases, an image sensor can be disposed on other surface of the substrate.

The module also includes a flexible seal that in many implementations circumscribes the infrared cut filter. The flexible seal creates a sealed volume enclosing the infrared cut filter. In some cases, the flexible seal is coupled between a lens or lens group and the upper surface of the substrate. The flexible seal is flexible in at least one axis, so that the seal can move with translations of the substrate, such as in response to actuation by an actuator.

In this manner, the flexible seal subdivides the interior volume of the module housing into two separate sealed volumes that each enclose two separate fluids. A first sealed volume seals a quantity of a first fluid, which is an optically transparent fluid (either a liquid or gas). The first sealed volume is defined between the image sensor, the infrared cut filter, and an underside of the lens or lens group. The flexible seal also defines a second sealed volume that seals a quantity of a (typically dielectric) fluid. In many cases, the second fluid may be optically transparent, although this is not required of all embodiments. In many cases, the second fluid is a liquid (e.g., mineral oil) and the first fluid is a gas (e.g., air).

As a result of these constructions, the second fluid can serve as a heat sink for electronic components within the camera module, thereby permitting longer execution of higher power operations (e.g., higher frame rate, more preprocessing image processing, faster autofocus operations, and so on).

These foregoing and other embodiments are discussed below with reference to FIGS. 1A-6. However, those skilled in the art will readily appreciate that the detailed description given herein with respect to these figures is for explanation only and should not be construed as limiting.

FIG. 1A depicts an example electronic device that can include a camera system and/or camera module, such as described herein. The electronic device 100 may be a portable electronic device, such as a cellular phone, wearable device, laptop, desktop computer, or tablet computing device. It may be appreciated, however, that a portable electronic device is merely one example device that can include a camera system and/or camera module as described herein. In some cases, the camera module may be incorporated into larger electronic device such as medical or surgical equipment, motion capture devices, vehicles (e.g., for security cameras, driver assist, or automated driving purposes), and so on.

The electronic device 100 as depicted in FIG. 1A is defined at least in part by a housing, identified in the figure as the housing 102. The housing 102 can enclose and support one or more components of the electronic device 100, such as a processor, one or more memory components or circuits, a battery, and a display 104.

For simplicity of description and illustration, FIG. 1A is depicted without many of these components; a person of skill in the art may readily appreciate that a number of components, circuits, structures, and systems can be included in the housing 102 of the electronic device 100. For example, the electronic device 100 can include a processor configured to access a memory to instantiate a software application configured to render a graphical user interface 106 via the display 104.

Figure 1B:
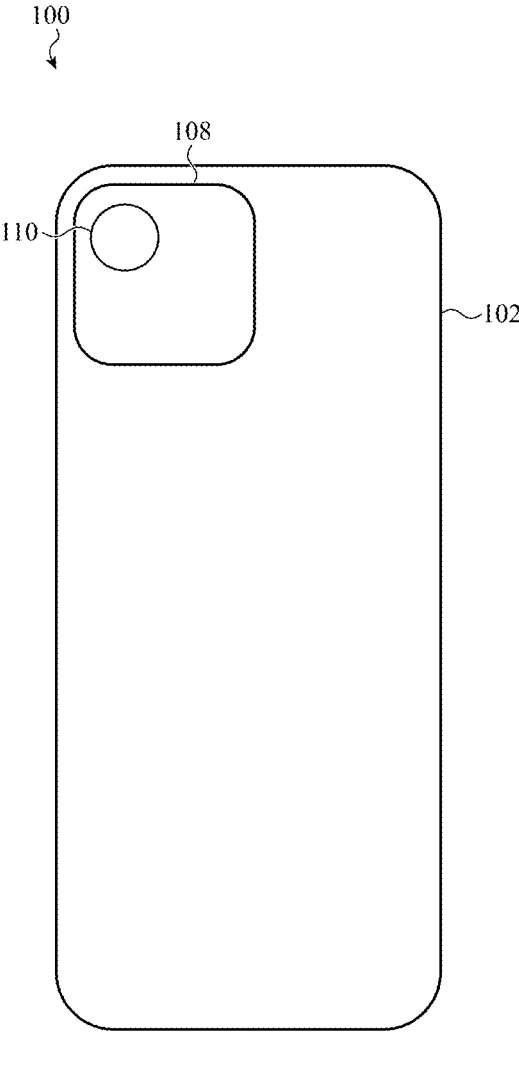
FIG. 1B depicts the example electronic device of FIG. 1A, showing a camera module, such as described herein.

The software application can, in some examples, be configured to integrate with one or more hardware sensors or sensing systems of the electronic device 100, such as a camera module. FIG. 1B depicts the example electronic device of FIG. 1A, showing an imaging system 108. The imaging system 108 can include a protective cover glass, behind which a camera module 110 can be positioned.

In particular, the camera module 110 can include an image sensor disposed at an image plane defined by a lens group of the camera module 110. The lens group(s) may define a fixed or variable focal length for the image sensor. For simplicity of description, a single image sensor and lens group are described with reference to the embodiments that follow; it is appreciated that in many cases, the imaging system can include multiple camera modules, or camera modules including multiple lens groups, multiple image sensor, and so on.

As noted above, a lens group and/or an image sensor may be movable. In many cases, the movable element(s) can include an image sensor and/or one or more lenses of a lens group. For example, an image sensor can be operably coupled to an actuator structure configured to translate the image sensor by a distance in a direction in plane with, or at an angle with respect to, an active imaging area of the image sensor.

In other cases, the actuator structure can be configured to translate the image sensor, in plane, by a first distance in a first direction (e.g., along an X axis), and by a second distance in a second direction (e.g., along a Y axis). In yet other examples, the actuator structure can be configured to translate the image sensor in three directions, for example, X, Y and Z axes (e.g., translating out of X-Y plane).

In other cases, the actuator structure can be configured to pivot about one or more fulcrums so as to change one or more angles describing a relative position between a normal vector of the imaging plane (e.g., in plane with an active imaging area of the image sensor) and a central axis of one or more lenses above the image sensor.

For example, the image sensor may be configured, by the actuator structure, to tilt or otherwise rotate relative to a central axis of a lens group. More simply, in some cases lenses can pivot or rotate relative to a normal vector in respect of a positionally-fixed image sensor, in other cases an image sensor can pivot or rotate relative to a normal vector in respect of a positionally-fixed lens group, in yet other cases, both an image sensor and lens groups can move relative to a module housing.

As may be appreciated by a person of skill in the art, a movable image sensor may be useful for optical image stabilization purposes. In other cases, movement of an image sensor may be intentionally induced so as to impart a unique imaging effect, such as tilt-shift photographic techniques.

In other cases, one or more lenses may be additionally or alternatively movable by a separate actuator structure to the actuator structure described above. A movable lens may be configurable to pivot, translate in plane, translate out of plane, rotate, and so on.

An actuator structure as described herein typically includes at least one coil that leverages Lorenz force to physically move itself relative to a permanent magnet or, in some constructions, to move a magnet relative to itself. In other cases, leveraging the Lorenz force may not be required of a particular design or implementation; a coil may be used as a solenoid to attract or repel a ferromagnetic or diamagnetic material. In many cases, an actuator structure can include multiple coils. For example, three coils may be used to control three degrees of freedom of a movable image sensor.

An "actuator structure," as referenced herein, can be operably and/or conductively coupled to an actuator controller which may be implemented as an application specific integrated circuit within a camera module, such as the imaging system 108. In some embodiments, the actuator controller may be operably coupled to an instance of firmware instantiated by cooperation of a processor and memory of the imaging system 108.

The actuator controller may receive instructions and/or signals from the instance of firmware and/or from the processor directly, to apply a voltage or current to one or more coils in order to change a physical position of a movable element of the imaging system 108 (such as a lens or the image sensor).

For example, in some cases, a particular magnitude of current may be circulated through a specified coil that is, itself, within a magnetic field originating from a permanent magnet nearby in order to induce a Lorenz force of known magnitude to cause the coil (and elements physically coupled to the coil) to move in a particular direction. More simply, the actuator controller may receive one or more instructions to move a movable element in a particular direction for a particular distance and/or to a particular angle. The instruction can correspond to a particular actuation current that, after calibration (either during manufacturing or in the field), is associated with a particular movement. More specifically, particular current or particular voltage can be presumed by the imaging system 108 to move a particular moveable element to a specific location, in a particular amount of time.

In some cases, the actuator controller can receive a voltage signal or current signal having a magnitude, pulse width, phase, and/or frequency that correlates to a desired output direction, magnitude and/or direction of movement. In other cases, the actuator controller can be configured to receive a digital value corresponding to the same.

In some cases, the actuator controller can be coupled to and/or may include a memory storing a lookup table that correlates particular movements of a movable elements to particular currents or voltages applied to particular coils of a particular, given, camera module-such as the imaging system 108. Many constructions are possible.

In some cases, the actuator controller can be configured to receive as input an output provided by an accelerometer or gyroscope. This output can be inverted, scaled, and converted to a movement instruction executed by the actuator controller to cause an associated actuator structure to move a movable element, such as an imaging sensor or lens element.

In further embodiments, an actuator controller as described herein may be communicably and/or operably coupled to one or more instances of software executing over a processor disposed within the housing 102 of the electronic device 100. For example, in some embodiments, a software application instance instantiated over a processor and/or memory of the electronic device 100 can leverage the display 104 to generate a user interface with which a user of the electronic device 100 can interact. In some examples, the software application may be an imaging application, such as a camera control application.

The camera control application can present one or more user interface elements via the display 104 which may be selected by a user. In some cases, one of the user interface elements can be used by a user of the electronic device 100 to control a relative position of a movable element, such as to control a focal point, a focal length, an alignment between the image sensor and a central axis (e.g., for tilt-shift imaging) defined by a lens group, and so on.

In other words, in some cases, the user interface may receive a signal or other input from a user including an instruction to cause an actuator controller to select and/or apply an appropriate signal as input to an actuator structure, and in particular, to a coil of an actuator structure to cause the coil to generate a magnetic field of particular orientation and magnitude, thereby inducing a movement.

As noted above, repeated operation of an actuator as described herein can generate heat. In addition, operation of imaging electronics such as imaging processors (e.g., the application specific integrated circuit described above) and/or operation an image sensor itself may generate heat.

As noted above, the imaging system 108 can include a camera module with an internal volume in which a heat-absorbing fluid is retained. In some cases, this volume may exclusively contain the heat-absorbing fluid (e.g., the fluid substantially fills the volume), whereas in other cases, the volume may retain a smaller volume of the fluid.

The fluid may be a dielectric fluid, such as a liquid dielectric, but this is not required of all embodiments. The fluid may be optically transparent, but this is also not required of all embodiments.

As may be appreciated by a person of skill in the art, the fluid may serve as a thermal mass to dissipate heat away from electronic components within a camera module, thereby permitting the module to operate for longer periods before triggering a thermal throttling or thermal cutoff event.

In addition, lower accumulated heat within a camera module can enable use of other actuator structures, such as those leveraging shape memory alloys. For example, as may be known to a person of skill in the art, a shape memory alloy (such as nitinol), may be a fast and highly accurate means by which an actuator structure as described herein can be positioned. More simply, as a result of the thermal mass of the retained fluid as described herein, a camera module can include a shape memory alloy actuator structure which may be more accurate and precise, may operate more quickly than other conventional actuators, and/or may operate for a longer duration as compared to shape memory alloy structures operating in the presence of air.

These foregoing embodiments depicted in FIGS. 1A-1B and the various alternatives thereof and variations thereto are presented, generally, for purposes of explanation, and to facilitate an understanding of various configurations and constructions of a portable electronic device that can incorporate a camera module, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 2:
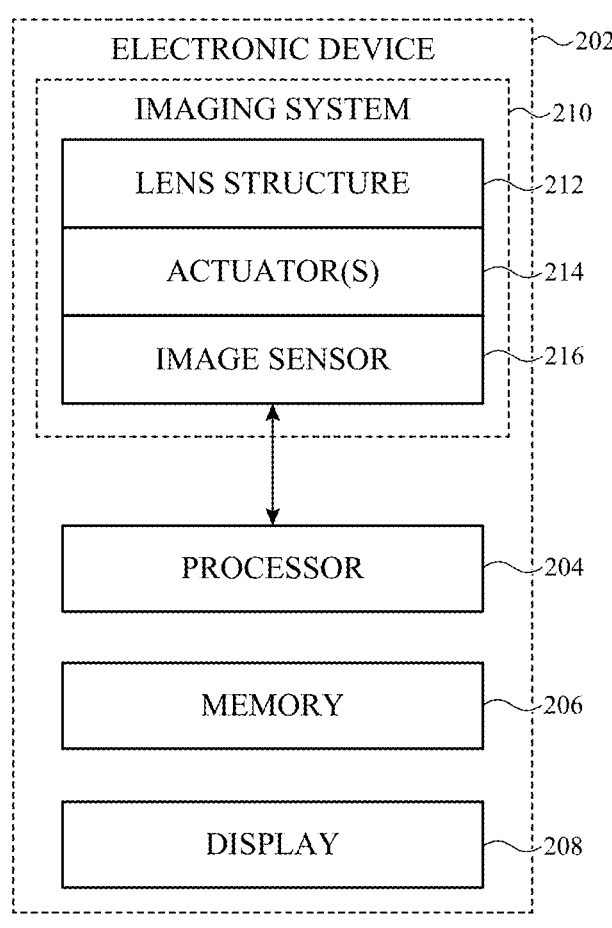
FIG. 2 is a simplified system diagram of an electronic device as described herein.

For example, more generally and broadly, it may be appreciated that any suitable electronic device can include a camera module as described herein. FIG. 2 is a simplified system diagram of such an example electronic device that can include a camera module with at least one actuator, as described herein.

For example, an electronic device that can include a camera system and/or camera module as described herein can be implemented as an example electronic device, identified in FIG. 2 as the electronic device 200.

The electronic device 200 can include a housing 202 that encloses and supports a processor 204, a memory 206, and (optionally) a display 208. As noted with respect to other embodiments described herein, the processor 204 can be configured to access the memory 206 to retrieve one or more computer-executable instructions and/or other executable assets in order to instantiate one or more instances of software that, in turn, may perform or coordinate one or more operations performed by the processor 204.

The instance of software can operate with or without user input. In some cases, the instance of software can be configured to operate as firmware of an application specific integrated circuit disposed within and/or shipped within a camera module such a described herein. In other cases, the software instance can be instantiated over a processor or coprocessor of an electronic device, such as the electronic device 200

For example, in some embodiments, the electronic device 200 can leverage the processor 204 and the memory 206 to instantiate an instance of a photography or videography software application. The photography software application instance can be configured to access and/or communicably couple to a camera module 210 of the electronic device 200.

As described herein, the term "processor" refers to any software and/or hardware-implemented data processing device or circuit physically and/or structurally configured to instantiate one or more classes or objects that are purpose-configured to perform specific transformations of data including operations represented as code and/or instructions included in a program that can be stored within, and accessed from, a memory. This term is meant to encompass a single processor or processing unit, multiple processors, multiple processing units, analog or digital circuits, or other suitably configured computing element or combination of elements.

Similarly, the term "memory" refers to any software and/or hardware-implemented data processing device or circuit physically and/or structurally configured to define a temporary or durable (e.g., volatile or nonvolatile) storage media configured to store one or more data structures or files and so on, regardless of media type (e.g., optical, magnetic, electric, photonic, and so on).

The camera module 210, which can be disposed within its own module housing (not identified in the figure) can include a lens structure 212, an actuator structure 214, and an image sensor 216. The lens structure 212 can be configured to receive and focus light from a scene external to the electronic device 200 that may be imaged by the image sensor 216.

The lens structure 212 can include any suitable number of optical elements configured to modify a phase or direction of light passing therethrough. The lens structure 212 can include one or more movable or fixed concave or convex lenses; the configuration and/or position of the lenses of the lens structure 212 can vary from embodiment to embodiment and may be controlled at least in part by the actuator structure 214. The lens structure 212 can define an imaging axis that may align with a normal vector normal to a planar surface of the image sensor 216, the imaging surface. In other cases, the imaging axis may reflect from one or more reflective surfaces such as in a periscopic lens configuration.

In some cases, the lens structure 212 can also include one or more filters configured to exhibit selected reflectance and/or transmittance for particular bands of light. For example, the lens structure 212 can include an infrared cut filter configured to reflect infrared light away from the image sensor 216. In other cases, an infrared cut filter may be configured to absorb infrared light. In yet other cases, the lens structure 212 can include one or more color filters configured to reflect particular colors of light. In yet other cases, the lens structure 212 can include one or more reflective surfaces, such as mirrors or beam splitters configured to redirect a path of light as it passes through the lens structure 212. For example, in some constructions the camera module 210 can be implemented with a periscopic lens structure.

These forgoing examples are not exhaustive of the types or arrangements of optical elements that can be leveraged by a camera module, such as described herein. In particular, it may be appreciated by a person of skill in the art that the lens structure 212 can include any number of suitable optical elements, arranged in any suitable order, for any particular embodiment. Further, as noted above, in some cases, the actuator structure 214 can be configured to move the image sensor 216 itself.

As noted above, the actuator structure 214 can be configured to move the image sensor 216 and/or one or more elements of the lens structure 212. In some embodiments, the actuator structure 214 can include multiple actuators each configured to move or reposition different portions of the camera module 210.

In many embodiments, the camera module 210 can further include a sealed volume in which a volume of fluid is retained. As with other embodiments, the fluid may be a dielectric fluid such as mineral oil. The fluid may be configured to absorb heat generated by the camera module 210 or other components of the electronic device 200 such as the processor 204, the memory 206, or the display 208.

These foregoing embodiments depicted in FIGS. 1A-2 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figures 3A, 3B:
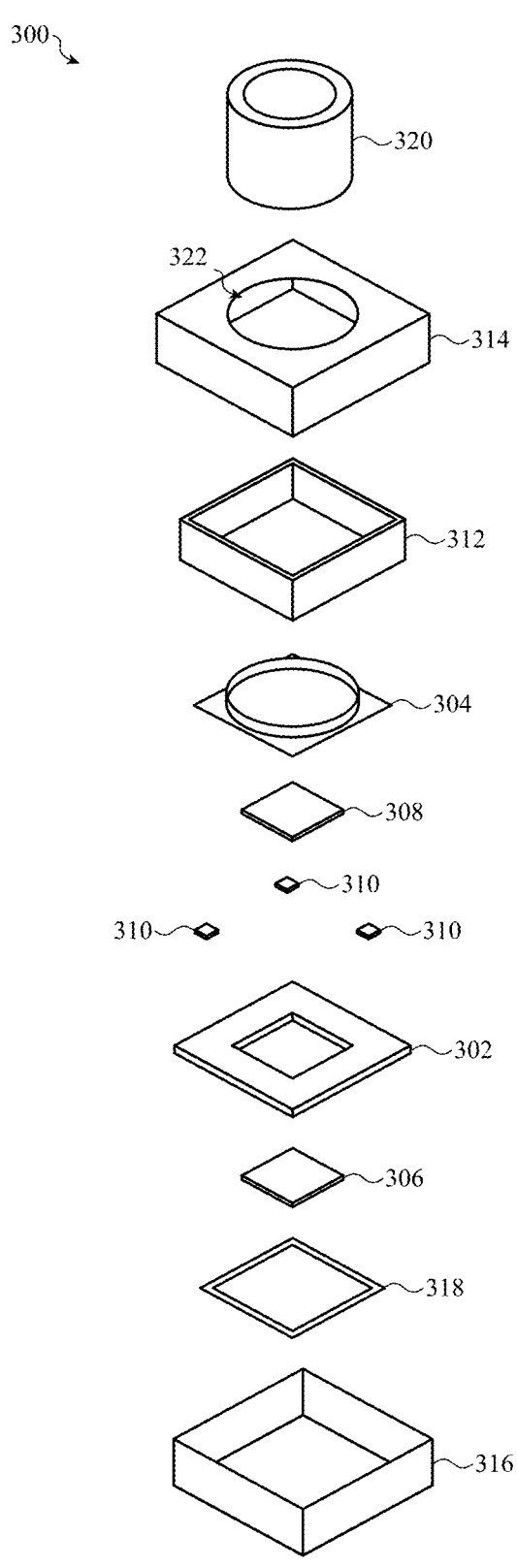
FIGS. 3A-3B depicts an exploded and assembled view of a camera module, as described herein.

A camera module as described herein can be implemented in a number of suitable ways, and may take a number of suitable form factors. In many examples, as noted above, a camera module can take a small form factor suitable for inclusion within a housing of a low-profile electronic device such as a cellular phone. FIGS. 3A-3B depicts such a configuration, although it may be appreciated that this is merely one example construction.

The camera module 300 can include one or more lens elements or groups that cooperate to define a focal plane aligned with an active imaging area of an image sensor. As with other embodiments described herein, one or more elements of the camera module 300 can be movable. To facilitate movement of one or more elements of the camera module (e.g., lenses, image sensor, and so on), flexible circuit boards may be used to accommodate and support functional electronics associated with the camera module 300.

FIGS. 3A-3B show a perspective view of a camera module, as described herein. With reference to each of FIGS. 3A-3B, the camera module may include the flex circuit, an image sensor, lens, an actuator assembly, a module enclosure, a flexible seal, and other components.

In particular the camera module includes a lens group enclosed within a barrel positioned within an opening defined by a baffle, which may also be referred to as an upper housing part or an upper enclosure part. The baffle can be coupled to a lower housing part, also referred to as a shield can. The baffle and the lower housing part cooperate to define a module housing for the camera module. The baffle and the lower housing part can be formed from metal, but this is not required of all embodiments. These parts may be welded, friction fit, riveted, or otherwise adhered (e.g., conductive epoxy, such as silver epoxy) to one another during assembly of the camera module. In many embodiments, these parts are hermetically sealed to one another so that the module enclosure can retain a fluid therein, such as described above. More generally, the module enclosure may be configured to at least partially enclose the various components of the camera module, and in some variations may act to shield internal camera components from interference as well as to shield other components or devices external to the housing from electromagnetic interference originating within the camera module.

The lens group includes one or more lens elements configured to direct light received by the camera toward an image sensor of the camera module. In some instances, the camera module may be configured to have a folded optics arrangement, where the camera module further includes one or more mirrors or prisms to redirect the light captured by the camera. It should be appreciated that in a folded optics arrangement, the optical axis of the lens group and camera module may extend along multiple directions (e.g., a light folding element such as a prism or mirror may change the direction of the optical axis).

For simplicity, the "optical axis" of a camera module is a portion of an optical axis of a lens, as light exits the lens and propagates toward an image sensor. The optical axis of an image sensor is considered to be a vector normal to a plane of an active image area of the image sensor; the normal vector is typically parallel to the optical axis. In folded optics arrangements, the optical axis may reflect once or more before intersecting the imaging area of an image sensor.

The camera module can include a carrier configured to move in one or more directions. The carrier can be mechanically coupled to an image sensor such that repositioning of the carrier respectively causes repositioning of the image sensor.

In the illustrated construction, the image sensor may receive light through the lens group, and may generate one or more signals that may convey information about the light received during imaging (which are conveyed off the image sensor via a flex circuit). The image sensor may be any suitable sensor, such as a CCD, CMOS sensor, or the like. In some cases, the lens group, or a portion thereof, may be configured to move within the camera, by operation of an actuator assembly configured to move the carrier.

As mentioned above, the image sensor (and/or portions of the lens group) may be configured to move within the camera (e.g., relative to at least the module enclosure). For example, the image sensor may be moved relative to the lens group along the optical axis of the camera module to adjust the camera's focus, which may allow the camera module to provide autofocus. Additionally or alternatively, the image sensor may be moved relative to the lens in one or more directions perpendicular to or otherwise not aligned with the optical axis of the camera module, which may allow the camera module to provide optical image stabilization capabilities.

It should be appreciated that the cameras described may be configured to perform both autofocus and optical image stabilization, or it may be configured to perform only one of these operations. Furthermore, in some instances, the camera module may be further configured to adjust the position or optical power of the lens group to assist with autofocus and/or optical image stabilization operations. This may be achieved by moving one or more lens elements of the lens group relative to the image sensor. Additionally or alternatively, the lens group may comprise a variable focus lens element (e.g., a liquid lens), which may be actuated to adjust the optical power and/or optical axis of the lens element.

Autofocus and optical image stabilization operations may be performed by any suitable combination of positional adjustments of the image sensor and/or the lens group. With reference to FIG. 1B, the camera module may further comprise an actuator assembly configured to move the image sensor within the camera module.

The actuator assembly includes an actuator and is coupled to the carrier, which may be more generally referred to as a suspension arrangement. The actuator can be configured to generate forces needed to move the image sensor, and may comprise a voice coil motor, a comb drive, a shape memory alloy-based actuator, or the like. In other cases, other mechanical couplings may be used for an actuator assembly such as described herein; suspension is not required of all embodiments. In some cases, as one example, bearings may be used.

In embodiments where the actuator includes a voice coil motor, the voice coil motor may comprise a magnet and a coil, one of which may be fixed relative to the image sensor (either via a direct connection to the image sensor, or via indirect connection via one or more intervening components or support structures) and the other of which may be fixed within the camera in a manner that allows the image sensor to move relative thereto.

The coil may be positioned within the magnetic field of the magnet such that when current is driven through the coil, a Lorentz force induces a change in relative position of the coil and magnet, which in turn may displace, tilt, translate, or rotate the image sensor within the camera module.

The suspension arrangement may comprise one or more suspension elements, such as flexures (e.g., leaf springs, suspension wires, flexure arms, and so on) and/or one or more bearings, and so on. In instances where the suspension arrangement includes one or more flexures, the flexures may provide a moveable connection between the image sensor (for example, via a holding structure that carries the image sensor) and one or more additional structures in the camera.

In instances in which the suspension arrangement includes one or more bearings, the bearings may be positioned between the moving the image sensor (e.g., via a holding structure that carries the image sensor) and one or more additional structures in the camera, and may guide image sensor movement.

FIG. 3A depicts a camera module 300 in an exploded assembly view, and FIG. 3B depicts the same camera module assembled. In particular, the camera module 300 includes a substrate 302 onto which a flexible seal 304 can be disposed. In particular, the flexible seal 304 can be formed from an elastomeric or plastic material configured to elastically deform in response to motion of the substrate 302.

The camera module 300 includes an image sensor 306 configured to be positioned relative to a central portion of the substrate 302. An infrared cut filter 308 can be positioned over the image sensor 306, and may be a reflective IR cut filter, an absorptive IR cut filter, or a layered combination thereof.

The camera module 300 can include a number of suitable actuators and actuator types, as noted above. In some embodiment, the camera module 300 includes an actuator that leverages shape memory alloys, such as nitinol. In such embodiments, a length of shape memory wire can couple the substrate 302 to an interior surface of the module housing such that when an electrical current is passed through the length of wire, the wire contracts and displaces the substrate 302 in a specific direction relative to the module housing. In other cases, a shape memory alloy can be formed in other shapes, and/or may be coupled to other surfaces to effect a translation or other positional change in the substrate 302. For simplicity of illustration, an example embodiment in which a group of three bodies of shape memory alloy are shown, as the shape memory alloys 310. These alloys can be mechanically coupled to the substrate 302 and/or a portion of the housing enclosing components of the camera module 300. When a fluid as described herein is positioned in contact with the shape memory wire, the fluid may act to dissipate heat from the shape memory wire and thereby accelerate a return to the shape memory wire's original shape.

In some embodiments, the camera module 300 can include multiple actuation systems, such as an electrostatic attraction system, a voice coil system, and a shape memory alloy system. In these examples, different systems may be leveraged for different purposes so as to maximize benefits of each respective system. In such examples, a shape memory alloy system may be used when low power consumption is preferred, whereas voice coil motor systems may be in circumstances where higher precision is preferred, and still other systems may be used in other circumstances.

The camera module 300 also includes a first carrier 312 configured to operate with one or more of the actuator systems to move the substrate (and in turn the image sensor 306) in X, Y, or Z directions. The assembly as described above can be protected by a baffle 314 configured to interface with a correspondingly shaped lower housing part, identified as the shield 316. The first carrier 312 can be associated with a second carrier 318 disposed on and/or coupled to a lower portion of the substrate 302.

The assembly further includes a lens barrel 320 configured to occupy a fixed position within an opening 322 defined by the baffle 314. In many embodiments, the lens barrel 320 is sealed by an adhesive to the baffle 314. In addition, the baffle 314 and the shield 316 may be hermetically sealed together. Further still, an opening accommodating a flex cable exiting the camera module 300 may be sealed as well (e.g., via an epoxy or other suitable sealant).

The lens barrel 320 is flexibly coupled to the substrate 302 via the flexible seal 304. Specifically, the flexible seal 304 can include a rounded portion configured to mate to and coupled to a lower surface of the lens barrel 320. In addition, the flexible seal 304 can include a lower surface configured to mate and couple to an upper surface of the substrate 302. A person of skill in the art may appreciate that any suitable coupling or adhesive mechanism may be used to couple the flexible seal 304 to the lens barrel 320 and the substrate 302.

As a result of this construction, the flexible seal 304 subdivides the interior volume defined by the mating of the baffle 314 and the shield 316 into two separate volumes. A first volume is defined between a lower surface of the lens barrel 320 and an upper surface of the infrared cut filter 308 (and/or the image sensor 306). A second volume is defined in the remaining void space, specifically between an outer/exterior surface of the flexible seal 304 and an internal surface of the module housing defined by cooperation of the baffle 314 and the shield 316.

As noted above, the second volume can be filled with a liquid having a suitable heat capacity to serve as a heat sink for heat generated by the camera module 300, such as heat generated by operation of the shape memory alloys 310 or other actuation or imaging structures.

These foregoing embodiments depicted in FIGS. 3A-3B and the various alternatives thereof and variations thereto are presented, generally, for purposes of explanation, and to facilitate an understanding of various configurations and constructions of a camera module, such as described herein. However, it will be apparent to one skilled in the art that some of the specific details presented herein may not be required in order to practice a particular described embodiment, or an equivalent thereof.

Figure 4A:
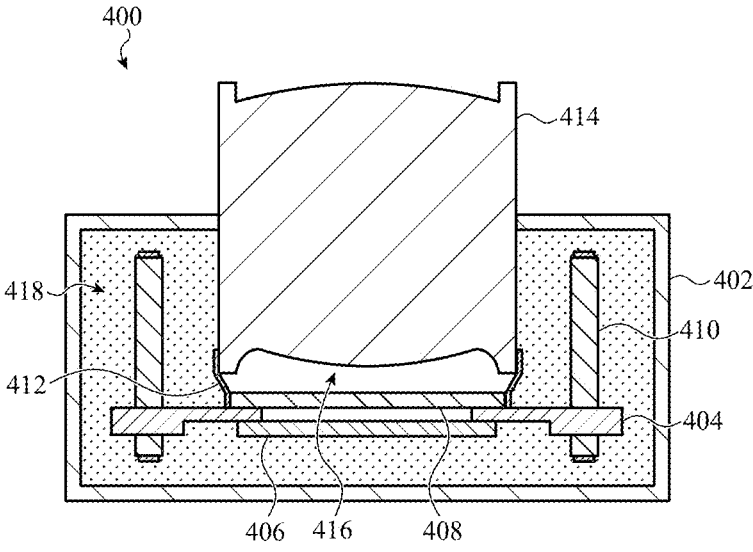
FIGS. 4A-4C depict cross-section views, taken through line A-A of FIG. 3B, of a camera module as described herein including a flexible seal that subdivides an interior volume into two sub-volumes, one retaining a first fluid and a second retaining a second fluid.
Figure 4B:
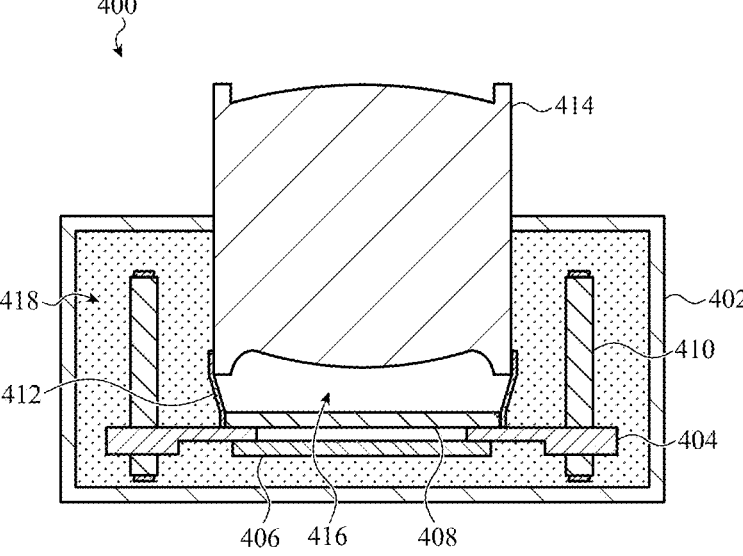
Figure 4C:
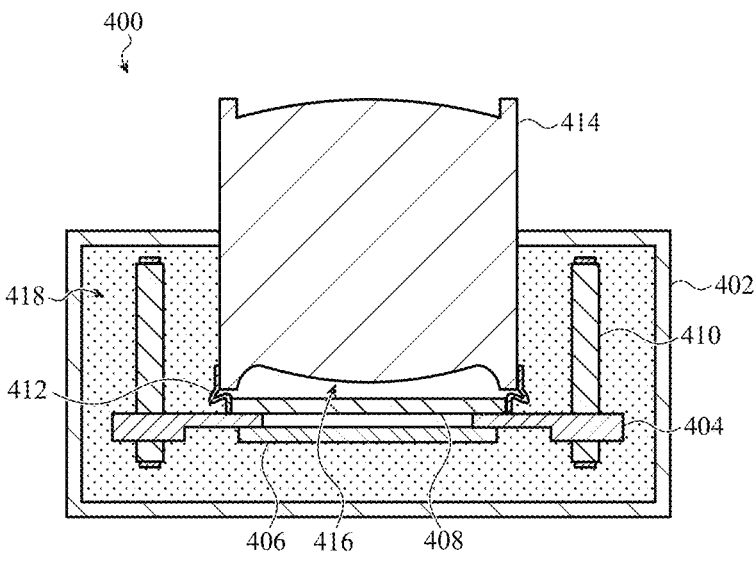

FIGS. 4A-4C depict cross-section views, taken through line A-A of FIG. 3B, of a camera module as described herein including a flexible seal that subdivides an interior volume into two sub-volumes, one retaining a first fluid and a second retaining a second fluid. In these embodiments, the camera module 400 includes a module housing 402 that encloses a substrate 404. The substrate 404 supports an image sensor 406 and, optionally, one or more filter elements such as an infrared cut filter 408. The substrate 404 can likewise be coupled to a carrier 410 that can be usable by an actuator structure (which can include shape memory alloy, in some examples) to move the substrate 404 along one or more axes. In other cases, the carrier 410 may not be required.

The camera module 400 also includes a flexible seal 412. The flexible seal 412 couples an upper surface of the substrate and/or a side surface of the infrared cut filter 408 to an edge surface of a lens element 414. The lens element 414 can be adhered to the module housing 402 so as to seal the internal volume of the module housing 402.

As shown in FIGS. 4A-4C, the flexible seal 412 subdivides the interior volume of the module housing 402 into at least two volumes sealed from one another. A first volume 416 is defined between the lens element 414 and an upper surface of the substrate 404, the infrared cut filter 408 and/or the image sensor 406. The first volume 416 can be filled with a gas such as air or nitrogen. In some embodiments, the first volume 416 can be filled with a liquid that has an index of refraction similar to air. These examples are not exhaustive; many constructions are possible.

A second volume 418 is defined between an outer surface of the flexible seal 412 and an interior surface of the module housing 402. This second volume, as shown in the figures, is external to and does not intersect the optical axis of the camera module 400. As a result, the second volume 418 can be used to retain a fluid, such as an oil as shown in FIG. 4A. As with other embodiments described herein, the fluid can serve as a heat sink for the camera module 400. The fluid can be opaque or transparent and may vary from embodiment to embodiment.

As noted above, the flexible seal 412 is flexible, and may be formed from an elastomeric material. FIG. 4A depicts the flexible seal 412 in a first position in which the substrate 404 is positioned in a first position.

FIG. 4B depicts the flexible seal 412 in a second position in which the substrate 404 is positioned in a second position in which the flexible seal 412 is extended relative to the configuration shown in FIG. 4A.

FIG. 4C depicts the flexible seal 412 in a third, flexed, position in which the substrate 404 is positioned in a third position, closer to the lens element 414.

These foregoing embodiments depicted in FIGS. 4A-4C and the various alternatives thereof and variations thereto are presented, generally, for purposes of explanation, and to facilitate an understanding of various configurations and constructions of a camera module, such as described herein. However, it will be apparent to one skilled in the art that some of the specific details presented herein may not be required in order to practice a particular described embodiment, or an equivalent thereof.

Figure 5:
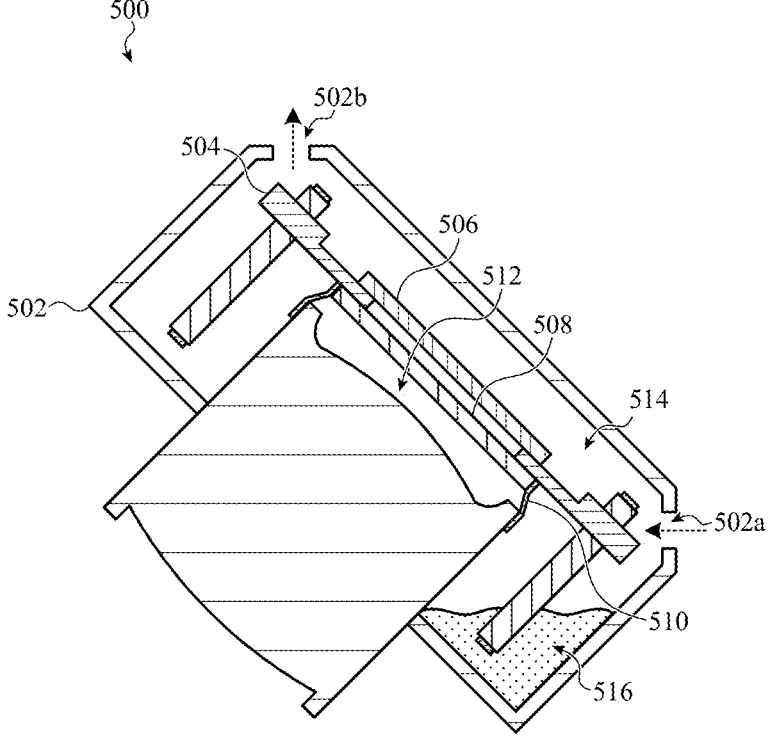
FIG. 5 depicts a cross-section view of a camera module as described herein in a fill orientation.

For example, FIG. 5 depicts another cross-section view, which may be taken through line A-A of FIG. 3B, of a camera module as described herein including a flexible seal that subdivides an interior volume into two sub-volumes, one retaining a first fluid and a second retaining a second fluid.

As with previously described embodiments, the camera module 500 includes a module housing 502 that encloses a substrate 504. The substrate 504 supports an image sensor 506 and, optionally, one or more filter elements such as an infrared cut filter 508. The camera module 500 also includes a flexible seal 510. The flexible seal 510 couples an upper surface of the substrate and/or a side surface of the infrared cut filter 508 to an edge surface of a lens element. The flexible seal 510 subdivides the interior volume of the module housing 502 into at least two volumes sealed from one another. A first volume 512 is defined between the lens element and an upper surface of the substrate 504 and the infrared cut filter 508. As with other embodiments, the first volume 512 can be filled with a gas such as air or nitrogen. In some embodiments, the first volume 512 can be filled with a liquid that has an index of refraction similar to air.

As with other embodiments described herein, the flexible seal 510 can define a second volume 514 between an outer surface of the flexible seal 510 and an interior surface of the module housing 502. This second volume is external to, and does not intersect, the optical axis of the camera module 500. As a result, the second volume 514 can be used to retain a fluid that may be used as a heat sink. Because the fluid is not in the optical path of the camera module 500, the fluid may be opaque without adversely impacting the operation of the camera module 500.

In this embodiment, the module housing 502 can include a fluid inlet 502a and a vent port 502b, which can be located in embodiment and/or implementation specific manners. As a result of this construction, the camera module 500 can be oriented such that the vent port 502b is oriented above the fluid inlet 502*a*. Thereafter, a fluid 516 can be pumped or otherwise injected into the fluid inlet 502*a* in order to fill the second volume 514, and to vent air out of the second volume 514 to the ambient environment via the vent port 502*b*.

Once a suitable volume of the fluid 516 has been injected into the fluid inlet 502*a*, the fluid inlet 502*a* and the vent port 502*b* may be sealed with, for example: melted plastic plugs; epoxy plugs; welding; and so on. In some cases, the camera module may be placed within a low pressure environment (e.g., a vacuum chamber) to remove any remaining gasses within the second volume 514 prior to sealing the vent port 502*b*.

Figure 6:
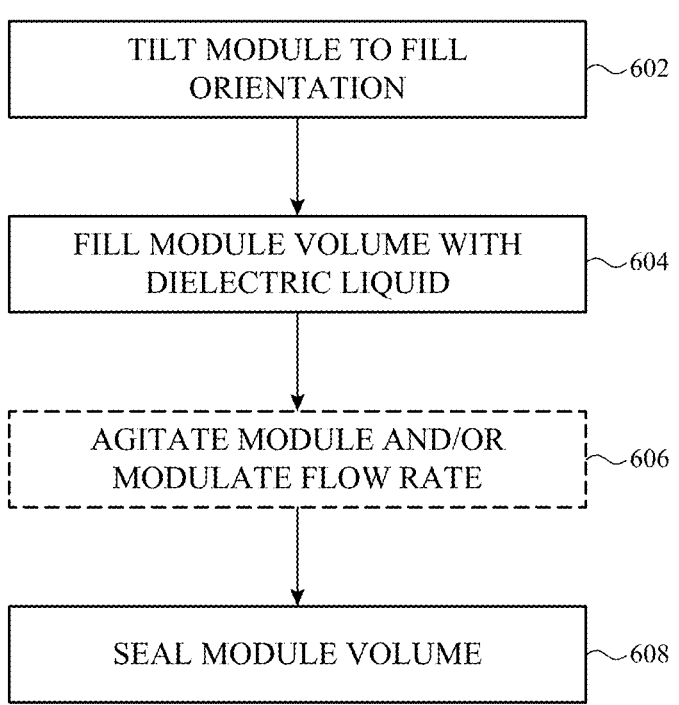
FIG. 6 is a flowchart depicting example operations of a method of manufacturing a camera module as described herein.

FIG. 6 is a flowchart depicting example operations of a method of manufacturing a camera module as described herein. The method 600 includes operation 602 at which a selected camera module is tiled to a fill orientation. Thereafter at operation 604, the module is filled with a dielectric material. Optionally, at 606, the module may be agitated and/or flow rate of the injected fluid may be modulated or changed to discourage formation of bubbles or entrapment of bubbles. Finally, at operation 608, the filled volume may be sealed in a permanent or semipermanent manner.

These foregoing embodiments depicted in FIGS. 5-6 and the various alternatives thereof and variations thereto are presented, generally, for purposes of explanation, and to facilitate an understanding of various configurations and constructions of a camera module, such as described herein. However, it will be apparent to one skilled in the art that some of the specific details presented herein may not be required in order to practice a particular described embodiment, or an equivalent thereof.

As used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of some embodiments, whether or not such embodiments are described and whether or not such features are presented as being a part of a described embodiment. Thus, the breadth and scope of the present description should not be limited by any of the above-described exemplary embodiments but is instead defined by the claims herein presented.

What is claimed is:

1. A camera module comprising:
a module housing defined by:
an upper housing part defining a lens opening; and
a lower housing part;
a lens element disposed within the lens opening;
a movable substrate within the module housing below the lens element;
an image sensor disposed on the movable substrate and aligned with the lens element;
a flexible seal coupling the substrate to the lens element and defining:
a first sealed volume defined between the image sensor and the lens element; and
a second sealed volume defined between an exterior surface of the flexible seal and an interior surface of the module housing;
a first fluid retained within the first sealed volume; and
a second fluid retained within the second sealed volume, the second fluid comprising a dielectric material.

2. The camera module of claim 1, wherein the first fluid is a gas and the second fluid is a liquid.

3. The camera module of claim 1, wherein the flexible seal comprises an elastomeric material.

4. The camera module of claim 1, comprising an infrared cut filter positioned over the image sensor and at least partially within the first sealed volume.

5. The camera module of claim 1, comprising an actuator configured to translate the image sensor along an axis.

6. The camera module of claim 5, wherein the actuator comprises a shape memory alloy.

7. The camera module of claim 1, wherein the lens element comprises a lens group and a barrel, the barrel coupled to the upper housing part and at least partially defining the second sealed volume.

8. A camera module comprising:
a module housing;
a lens element extending through the module housing;
a substrate within the module housing below the lens element and supporting an electronic component;
an image sensor disposed on the substrate;
a seal coupling the substrate to the lens element and defining a sealed volume between an exterior surface of the seal and an interior surface of the module housing; and
a fluid retained within the sealed volume and configured to absorb heat generated by the electronic component and the image sensor.

9. The camera module of claim 8, wherein the fluid is a dielectric fluid.

10. The camera module of claim 8, wherein the substrate is coupled to the module housing via a shape memory alloy.

11. The camera module of claim 8, wherein the electronic component comprises a processor.

12. The camera module of claim 8, wherein the electronic component comprises an actuator.

13. The camera module of claim 8, wherein the lens element is adhered to the module housing.

14. The camera module of claim 8 wherein the seal is a flexible seal and is configured to move in response to translation of the substrate.

* * * * *